(12) United States Patent
Hsia et al.

(10) Patent No.: US 11,444,630 B1
(45) Date of Patent: Sep. 13, 2022

(54) COLUMN ANALOG-TO-DIGITAL CONVERTER AND LOCAL COUNTING METHOD THEREOF

(71) Applicant: Novatek Microelectronics Corp., Hsinchu (TW)

(72) Inventors: Chih-Peng Hsia, Hsinchu County (TW); Cho-Hsuan Jhang, Hsinchu (TW); Su-Wei Lien, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 17/363,029

(22) Filed: Jun. 30, 2021

(51) Int. Cl.
  *H03M 1/34* (2006.01)
  *H03M 1/06* (2006.01)
  *H04N 5/3745* (2011.01)

(52) U.S. Cl.
  CPC ...... *H03M 1/0617* (2013.01); *H04N 5/37455* (2013.01)

(58) Field of Classification Search
  CPC ...... H03M 1/0617; H03M 1/12; H03M 1/001; H04N 5/37455

USPC ............... 341/155, 120, 118, 164
See application file for complete search history.

(56) References Cited

U.S. PATENT DOCUMENTS

| 2012/0176518 A1* | 7/2012 | Yamazaki | H03M 1/14 348/241 |
| 2013/0243147 A1* | 9/2013 | Kim | H03M 1/12 377/42 |
| 2019/0289238 A1* | 9/2019 | Ikuma | H04N 5/363 |

* cited by examiner

Primary Examiner — Peguy Jean Pierre
(74) Attorney, Agent, or Firm — JCIPRNET

(57) ABSTRACT

A column analog-to-digital converter and the local counting method is provided. The column analog-to-digital converter includes a plurality of analog-to-digital converters in parallel. Each of the analog-to-digital converters includes a comparator and a counting circuit. The comparator compares the ramp voltage with one of the plurality of column signals to generate a comparator output signal. The counting circuit triggers a delay line circuit of the counting circuit to generate first delay data according to the comparator output signal, re-triggers the delay line circuit to generate first re-trigger delay data according to a base clock, and compares the first delay data with the first re-trigger delay data to generate a first counting output.

18 Claims, 8 Drawing Sheets

COLUMN ANALOG-TO-DIGITAL CONVERTER AND LOCAL COUNTING METHOD THEREOF

BACKGROUND OF THE INVENTION

1. Field of the Invention

The invention relates to an image sensor, and particularly relates to a column analog-to-digital converter (column ADC) and its local counting method.

2. Description of Related Art

A conventional CMOS image sensor (CMOS Image sensor, CIS) generally adopts a column analog-to-digital converter (CADC). CADC is usually composed of multiple successive-approximation register analog-to-digital converters (SAR ADC) or multiple single-slope analog-to-digital converters (single-slope ADC). Each single-slope ADC receives a column signal corresponding to a row of pixels, and the multiple single-slope ADCs share a digital-to-analog converter (DAC), a high-speed clock generator and a sense amplifier.

The single-slope ADC uses a counter to calculate an output length of the signal generated by comparing a ramp voltage and the column signal as the output of the ADC. Therefore, the resolution of the ADC depends on available counting time and a counting frequency. Nevertheless, the counting frequency is often limited by a loading of the clock tree, which increases the counting time at high resolution of ADC. In addition, the CADC counter is faced with a serious challenge of power consumption due to high counting frequency.

Since Correlated Double Sampling (CDS) and High Dynamic Range Imaging (HDR) are widely spread in the applications such as touch control, image sensing, and fingerprint recognition, it results in reduced available counting time. Moreover, the frame rate is limited by conversion time of ADC.

A conventional technology adopts phase delays to increase the resolution of ADC without raising the counting frequency. For example, 3 phase delays are added to the Least Significant Bit (LSB) of the high-speed clock. That is, the half cycle of bit[0] is cut into four equal parts, so as to add 2 bits to the resolution of ADC. However, the phase delay of the LSB is usually generated by a delay-locked loop (DLL) or a phase-locked loop (PLL), which would enlarge the layout area and the power consumption. Besides, different phase delays require a path balance in the layout to avoid increasing the differential nonlinearity (DNL) of the ADC, yet it will step up the difficulty of layout design.

Another conventional technology uses a local delay line to generate multiple phases in LSB, and a logic circuit determines which phase the transition time of an input signal locates in, so as to output the corresponding binary code according to the determination result. Nevertheless, it requires additional trim circuits to eliminate the PVT variation.

SUMMARY OF THE INVENTION

The invention provides a column analog-to-digital converter (CADC) with a local counting method which enables a local counting by means of a local delay circuit to improve the counting resolution.

An embodiment of the invention provides a column analog-to-digital converter. The column analog-to-digital converter includes a plurality of analog-to-digital converters in parallel. Each of the analog-to-digital converters includes a comparator and a counting circuit. The comparator compares the ramp voltage with one of the plurality of column signals to generate a comparator output signal. The counting circuit triggers a delay line circuit of the counting circuit to generate first delay data according to the comparator output signal, re-triggers the delay line circuit to generate first re-trigger delay data according to a base clock, and compares the first delay data with the first re-trigger delay data to generate a first counting output.

An embodiment of the invention provides a local counting method. A column analog-to-digital converter includes a plurality of analog-to-digital converters in parallel. The local counting method of the each analog-to-digital converter comprises as below. Each analog-to-digital converter compares a ramp voltage with one of column signals to generate a comparator output signal. Each analog-to-digital converter triggers a delay line circuit of the counting circuit to generate first delay data according to the comparator output signal. Each analog-to-digital converter re-triggers the delay line circuit to generate first re-trigger delay data according to a base clock. Each analog-to-digital converter compares the first delay data with the first re-trigger delay data to generate a first counting output.

Based on the above, in the embodiments of the invention, in order to cope with the frequency limit caused by a timing violation and a long wire and to reduce a system complexity, the embodiments of the invention provide a column analog-to-digital converter (CADC) with a local counting method which enables a local counting by means of comparing the triggered result and re-triggered result of a local delay line circuit, so as to raise the counting resolution and perform a self-compensation without trim circuits.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
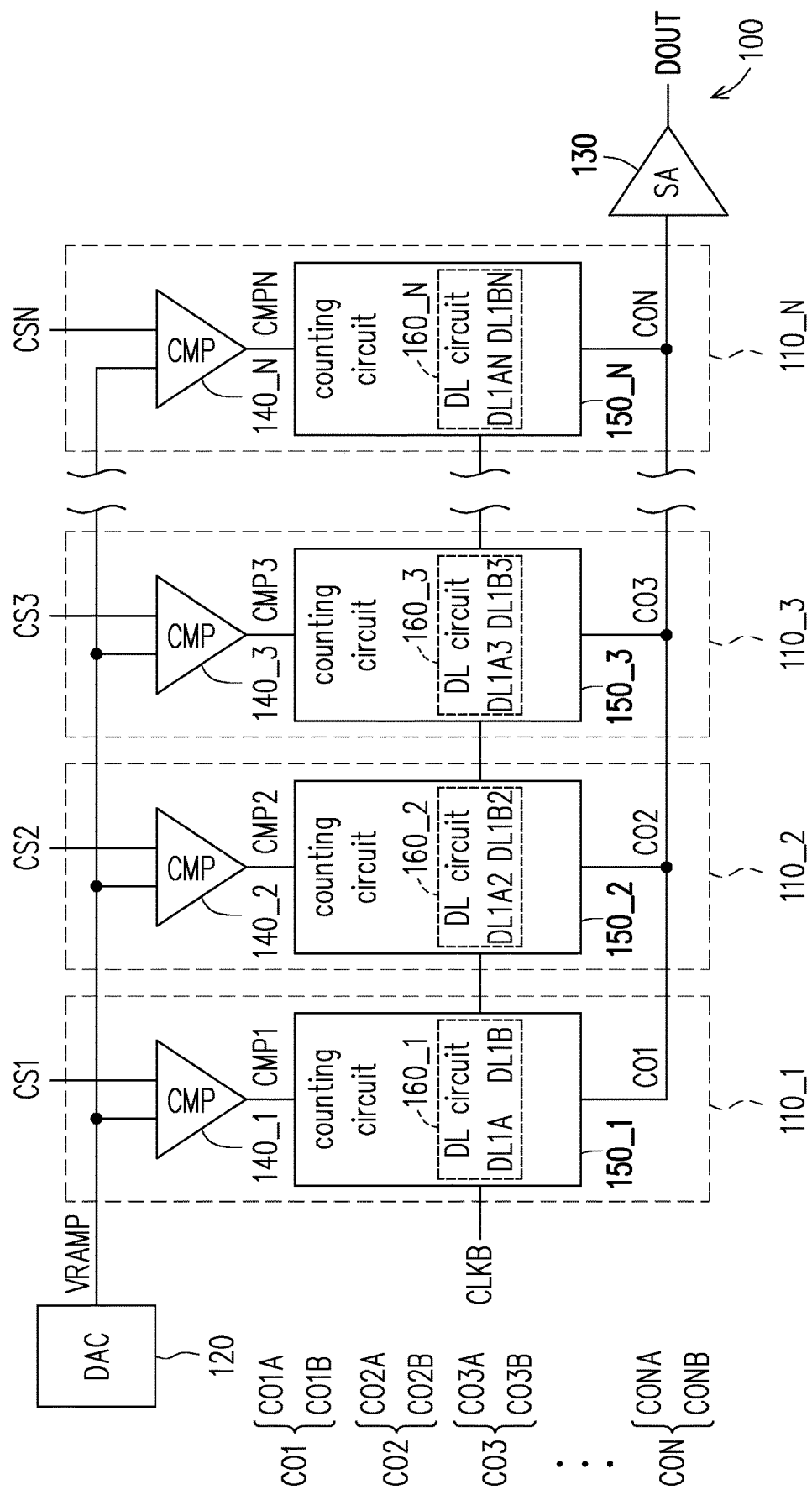
FIG. 1 is a schematic diagram illustrating a column analog-to-digital converter according to an embodiment of the invention.

Reference will now be made in detail to the embodiments of the invention, examples of which are illustrated in the accompanying drawings. Wherever possible, the same reference numbers are used in the drawings and the description to refer to the same or like parts.

Referring to FIG. 1, a column analog-to-digital converter 100 includes a plurality of analog-to-digital converters 110_1-110_N in parallel, a digital-to-analog converter 120 and a sense amplifier 130. The digital-to-analog converter 120 generates a ramp voltage VRAMP. The analog-to-digital converters 110_1-110_N receives the ramp voltage VRAMP, column signals CS1-CSN, and a base clock CLKB to generate the counting outputs CO1-CON. The column signals CS1-CSN are provided from corresponding columns of pixels of an image sensor, such as a CMOS Image sensor. The base clock CLKB may be implemented by a conventional VCO, PLL or DLL, but not limited. The sense amplifier 130 receives and reads the counting outputs CO1-CON (data) to generate an output DOUT (logic), and the output DOUT may be provided to bit lines of a memory. The implementations of the digital-to-analog converter 120 and the sense amplifier 130 are not limited in specific manner.

Giving the analog-to-digital converter 110_1 as an example, the analog-to-digital converter 110_1 includes a comparator 140_1 and a counting circuit 150_1, and the counting circuit 150_1 includes a built-in delay line circuit 160_1. The comparator 140_1 compares the ramp voltage VRAMP with the column signal CS1 to generate the comparator output signal CMP1. Thereafter, the counting circuits 150_1 triggers the delay line circuit 160_1 of the counting circuit 150 to generate first delay data DL1A according to the comparator output signal CMP1, re-triggers the delay line circuit 160_1 to generate first re-trigger delay data DL1B according to the base clock CLKB, and compares the first delay data DL1A with the first re-trigger delay data DL1B to generate a first counting output CO1A. The implementation of the comparator 140_1 is not limited.

In this embodiment, the counting circuit 150_1 further counts the base clock CLKB to generate a second counting output CO2B based on the comparator output signal CMP1, and combines the first counting output CO1A with the second counting output CO1B to generate a counting output CO1.

In addition, since the analog-to-digital converters 110_2-110_N are column repeats and similar with analog-to-digital converters 110_1, details thereof with corresponding comparators 140_2-140_N, counting circuit 150_2-150_N, delay line circuits 160_2-160_N comparator output signals CMP2-CMPN, first delay data DL1A2-DL1AN, first re-trigger delay data DL1B2-DL1BN, first counting outputs CO2A-CONA, and second counting outputs CO2B-CONB are not repeatedly again.

Figure 2:
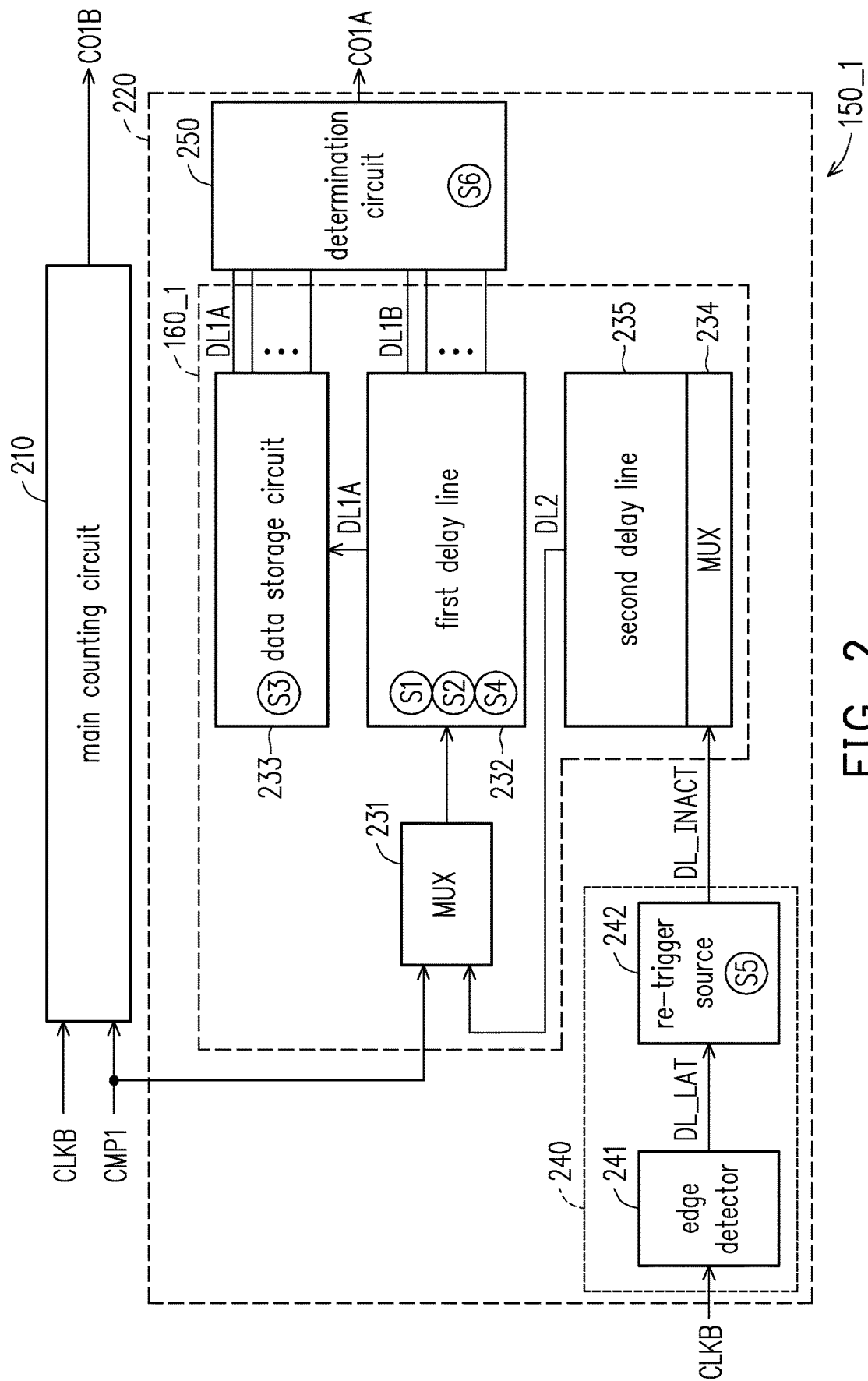
FIG. 2 is a circuit block diagram illustrating a counting circuit according to an embodiment of the invention.

FIG. 2 is a circuit block of the counting circuit 150_1 shown in FIG. 1 according to an embodiment of the invention. In the embodiment of FIG. 2, the counting circuit 150_1 includes a main counting circuit 210 and a local counting circuit 220. The main counting circuit 210 counts the base clock CLKB to generate the second counting output CO1B before the comparator output signal CMP1 is enabled, and is implemented based on the traditional single slope ADC, but not limited. The local counting circuit 220 triggers the delay line circuit 160_1 to generate the first delay data DL1A according to the comparator output signal CMP1 after the comparator output signal CMP1 are enabled, re-triggers the delay line circuit 160_1 according to the base clock CLKB to generate the first re-trigger delay data DL1B, and compares the first delay data DL1A with the first re-trigger delay data DL1B to generate the first counting output CO1A. The relevant timing will be described afterwards. It is noted that this architecture effectively increases the resolution of CADC since a local counting circuit 220 is added. For example, if the second counting output CO1B provided by the main counting circuit 210 is 10 bit and the first counting output CO1A provided by the local counting circuit 220 is 1 bit, the resolution of CADC would be raised to 11 bit. If the second counting output CO1B provided by the main counting circuit 210 is 10 bit and the first counting output CO1A provided by the local counting circuit 220 is 2 bit, the resolution of CADC would be raised to 12 bit.

Figure 3A:
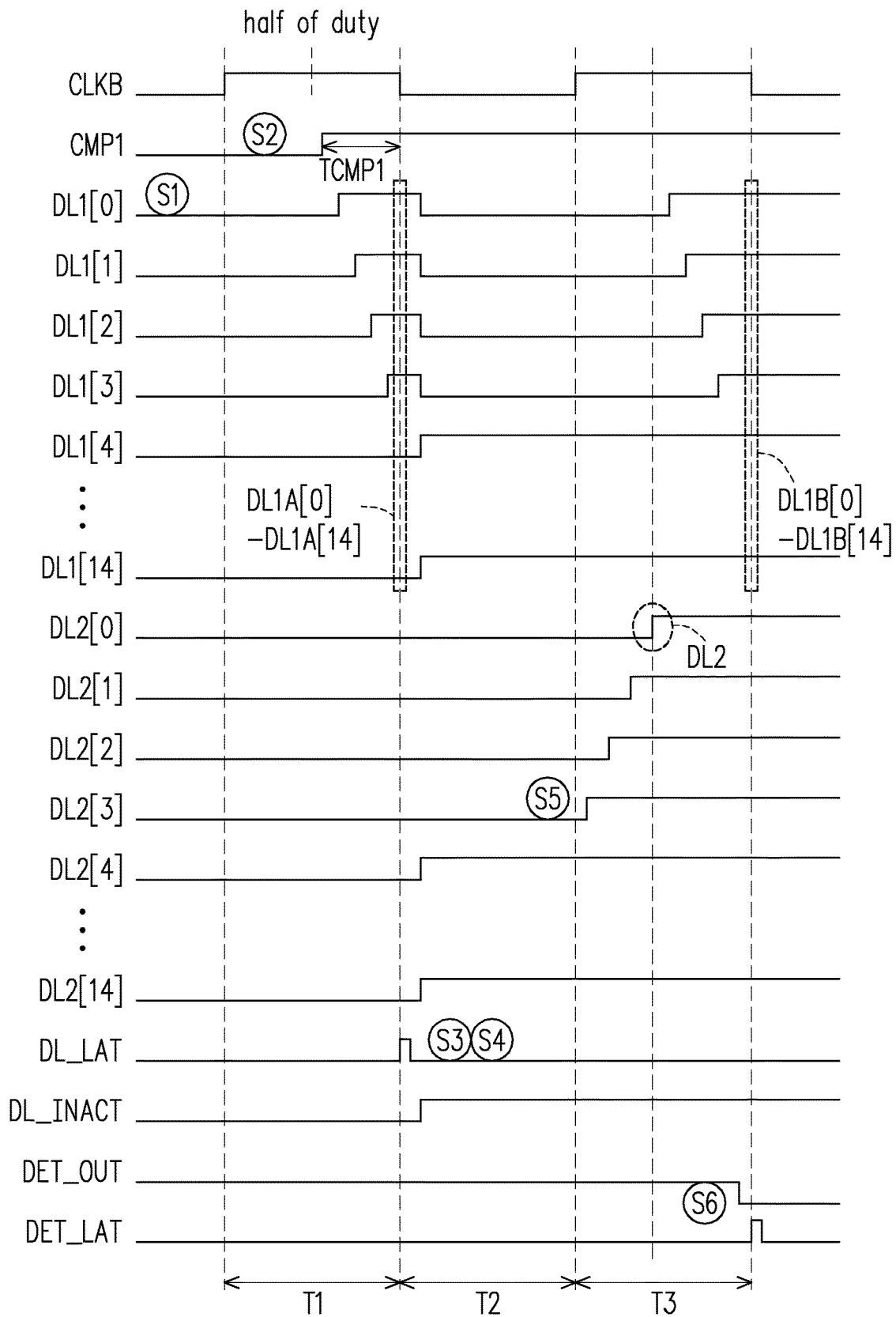
FIG. 3A is a timing diagram illustrating a local counting according to an embodiment of the invention.

The local counting circuit 220 includes the delay line circuit 160_1, a re-trigger circuit 240, and a determination circuit 250. Referring to FIG. 2 and FIG. 3A, the delay line circuit 160_1 receives the comparator output signal CMP1 and is triggered to generate the first delay data DL1A during a first period T1 of the base clock CLKB after the comparator output signal CMP1 is enabled.

The re-trigger circuit 240 is coupled to the delay line circuit 160_1. The re-trigger circuit 240 receives the base clock CLKB. During a second period T2, the re-trigger circuit 240 outputs a re-trigger signal DL_INACT to the delay line circuit 160_1 when detecting the edge of the base clock CLKB. The re-trigger circuit 240 re-triggers the delay line circuit 160_1 to generate the first re-trigger delay data DL1B according to the re-trigger signal DL_INACT during a third period T3. The second period T2 is later than the first period T1, and the third period T3 is later than the second period T2.

The determination circuit 250 is coupled to the delay line circuit 160_1. The determination circuit 250 receives the first delay data DL1A and the first re-trigger delay data DL1B from the delay line circuit 160_1, and compares the first delay data DL1A with the first re-trigger delay data DL1B to generate the first counting output CO1A. The details will be described thereafter.

Referring to FIG. 2 and FIG. 3A, the delay line circuit 160_1 includes a first multiplexer 231, a first delay line 232, a data storage circuit 233, a second multiplexer 234, and a second delay line 235. The first multiplexer 231 receives the comparator output signal CMP1 and second delay data DL2, and selects the comparator output signal CMP1 to be outputted during the first period T1 and selects the second delay data DL2 to be outputted during the third period T3. In this embodiment, the second delay data DL2 to be received by the first multiplexer 231 merely includes the output DL2[0].

The first delay line 232 is coupled to the first multiplexer 231, and includes a plurality of first buffers in series (not drawn). The first delay line 232 sequentially delays the comparator output signal CMP1 by means of the first buffers to generate the first delay data DL1A during the first period T1, and sequentially delays the second delay data DL2 to generate the first re-trigger delay data DL1B during the third period T3. The first delay data DL1A includes first delay data DL1A[0]-DL1A[14] as shown in FIG. 3A, and the first delay data DL1A[0]-DL1A[14] corresponds to outputs DL1[0]-DL1[14] of the first buffers during the first period T1, respectively. The first re-trigger delay data DL1B include first re-trigger data DL1B[0]-DL1B[14] as shown in FIG. 3A, and the first re-trigger data DL1B[0]-DL1B[14] corresponds to outputs DL1[0]-DL1[14] of the first buffers during the third period T3.

The data storage circuit 233 is coupled between the first delay line 232 and the determination circuit 250. The data storage circuit 233 stores the first delay data DL1A[0]-DL1A[14] during second period T2 in response to a delay line data latch signal DL_LAT.

In an embodiment, the second multiplexer 234 is coupled between the re-trigger circuit 240 and the second delay line circuit 235, and the second delay line circuit 235 is coupled between the second multiplexer 234 and the first multiplexer 231. The second delay line 235 is couple between the second multiplexer 234 and the first multiplexer 231, and the second delay line 235 includes a plurality of second buffers in series (not drawn).

The first buffers of the first delay line 232 and the second buffers of the second delay line 235 corresponding to not-inverted first delay data DL1A during the first period T1 are disabled according to the re-trigger signal DL_INACT during the second period T2. For example, referring to FIG. 3A, the outputs DL1[0]-DL1[3] are inverted and outputs DL1[4]-DL1[14] are not inverted during the first period T1. Accordingly, during the second period T2, the first buffers corresponding to outputs DL1[4]-DL1[14] and the second buffers corresponding to outputs DL2[4]-DL2[14] are all disabled according to the re-trigger signal DL_INACT, until the end of the third period T3.

During the third period T3, the second buffer corresponding to the output DL2[3] is selected by the second multiplexer 234 as the input of the second delay line 235, so that second buffers of the second delay line 235 generate the outputs DL2[0]-DL2[3] with pulse shifted and the outputs DL2[4]-DL2[14] disabled according to the re-trigger signal DL_INACT and the base clock CLKB, and in this embodiment, the first buffers of the first delay line 232 sequentially delay the second delay data DL2 to generate the first re-trigger delay data DL1B[0]-DL1B[14]. It is noted that in the embodiment shown in FIG. 3A, the output DL1[0] delays the second delay data DL2 to generate the first re-trigger delay data DL1B[0] at first. In the another embodiment shown in FIG. 3B, the first re-trigger delay data DL1B[0] is generated at last.

Referring to FIG. 2 and FIG. 3A, the re-trigger circuit 240 includes an edge detector 241 and a re-trigger source 242. The edge detector 241 receives the base clock CLKB and detects the transition of the base clock CLKB to generate a delay line data latch signal DL_LAT in the beginning of the second period T2. The re-trigger source 242 is coupled to the edge detector 241, and the re-trigger source 242 performs a step transformation on the delay line data latch signal DL_LAT to generate the re-trigger signal DL_INACT during the second period T2.

Please referring to FIG. 4A, FIG. 4B, FIG. 2 and FIG. 3, in step S1, the first delay line 232 resets the outputs DL1[0]-DL1[14] of the first buffers, so that the outputs DL1[0]-DL1[14] is reset to logic 0 before the comparator output signal CMP1 is enabled. Next, in step S2, when the comparator output signal CMP1 is enabled, the first delay line 232 starts to sequentially delay the comparator output signal CMP1, so as to generate the first delay data DL1A[0]-DL1A[14] when the based clock CLKB is transited from logic high to logic low. In this embodiment, the first delay data DL1A[0]-DL1A[3] is logic 1 and the first delay data DL1A[4]-DL1A[14] is logic 0 since the based clock CLKB is transited from logic high to logic low to stop the delay operation of the first delay line 232 just after the output DL1[3] is transited to logic high.

Figure 4A:
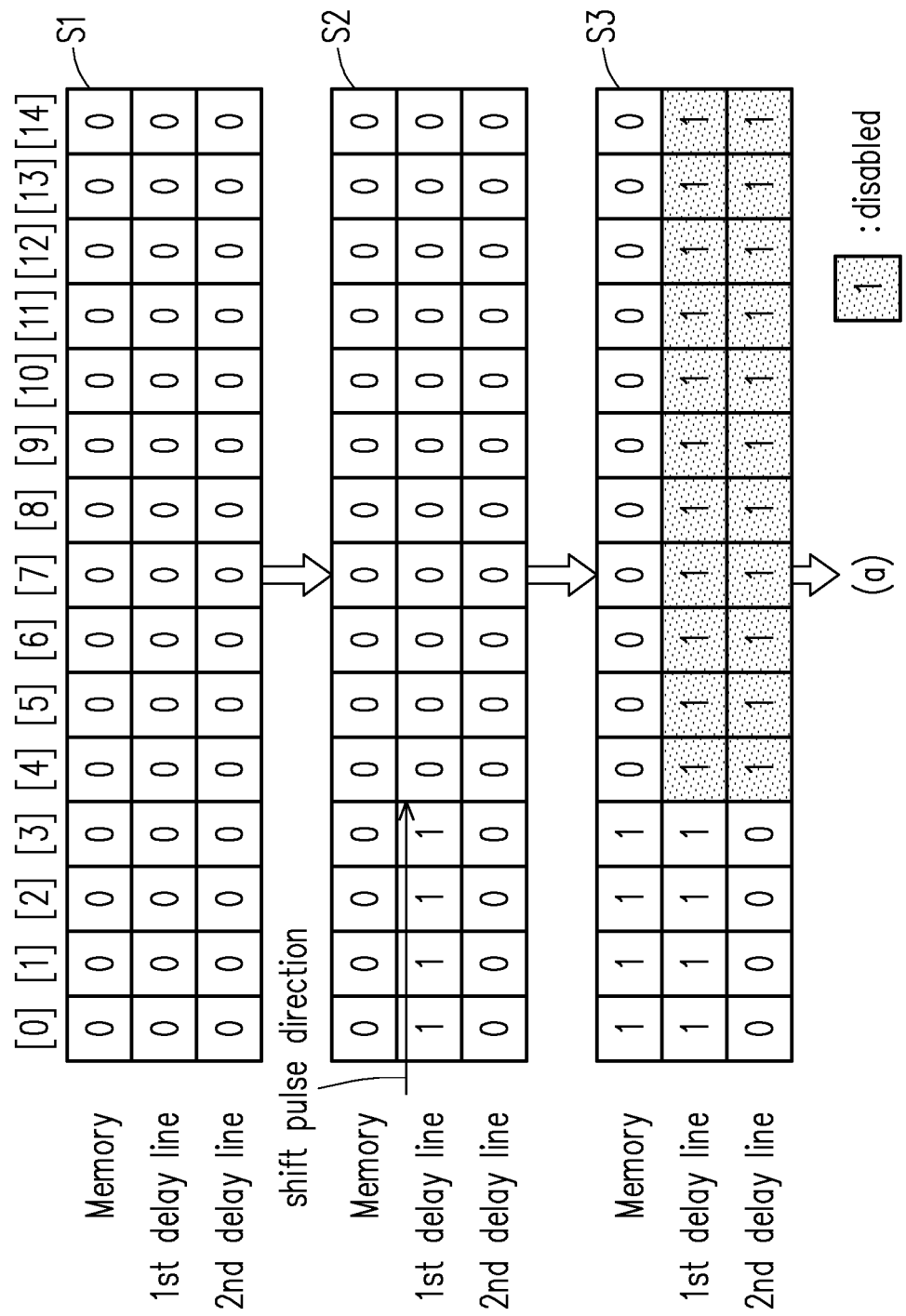
FIG. 4A and FIG. 4B are schematic diagrams illustrating a local counting according to an embodiment of the invention.
Figure 4B:
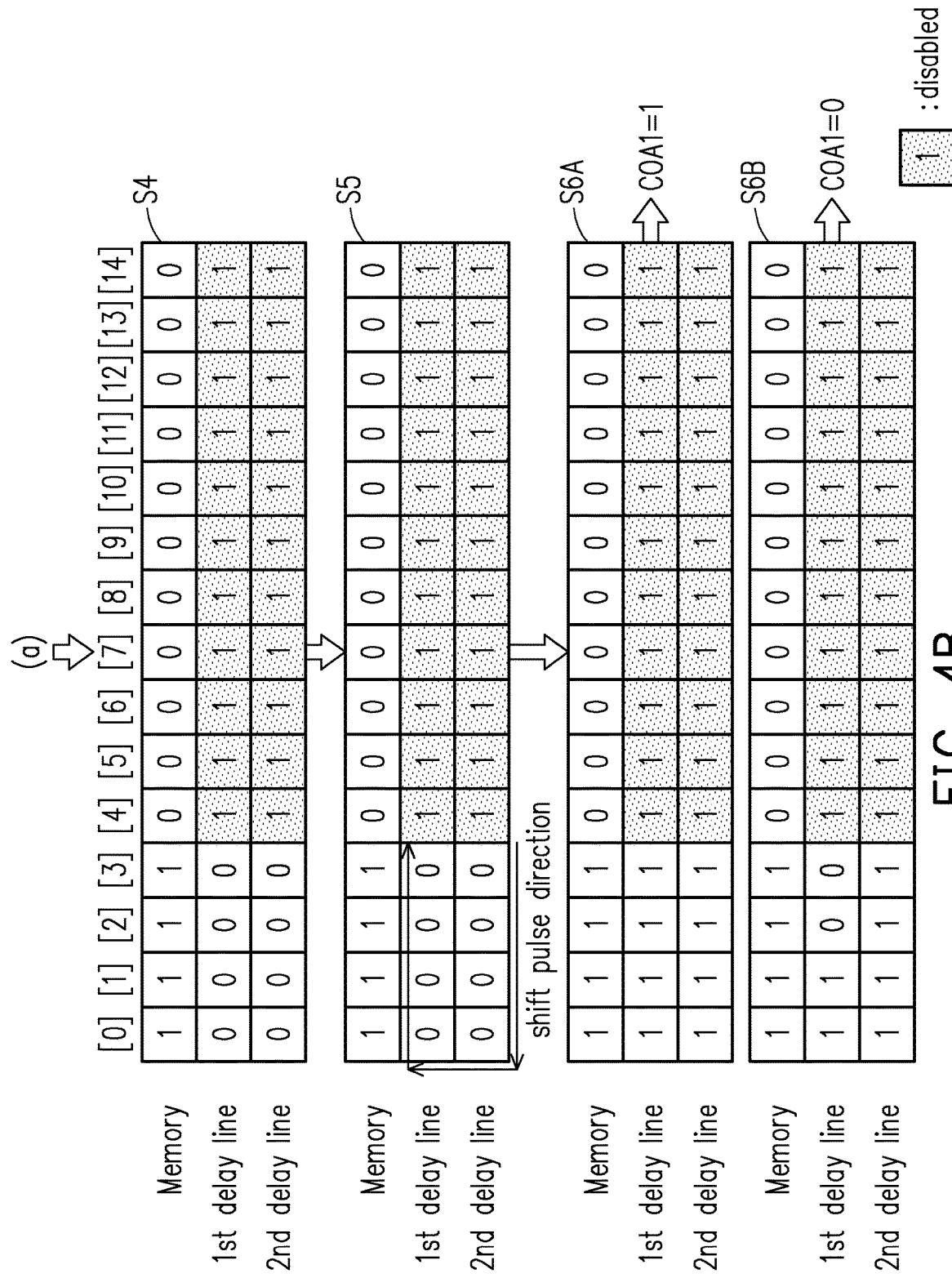

In step S3, when the delay line data latch signal DL_LAT is enabled, the data storage circuit 233 is activated to store the first delay data DL1A[0]-DL1A[14]. For example, the memory[0]-memory[3] shown in FIG. 4A are logic 1 same as the first delay data DL1A[0]-DL1A[3], and the memory [4]-memory[14] are logic 0 same as the first delay data DL1A[4]-DL1A[14]. In addition, the first buffers of the first delay line 232 and the second buffers of the second delay line 235 corresponding to non-inverted first delay data DL1A[4]-DL1A[14] are disabled when the re-trigger signal DL_INACT is enabled. For example, the outputs DL1[4]-DL1[14] of the disabled first buffers and the outputs DL2 [4]-DL2[14] of the disabled second buffers are set to 1 which depends on the design requirement, but not limited.

Next, in step S4, when the re-trigger signal DL_INACT is enabled, the first delay line 232 resets the outputs DL1[0]-DL1[3] of the first buffers, so that the outputs DL1[0]-DL1 [3] is reset to logic 0. In step S5, when the base clock CLKB is transited to logic high again detected by the edge detector 241, the re-trigger source 242 re-triggers the enabled second buffers of the second delay line 235 to sequentially generate the outputs DL2[3]-DL2[0] by selecting the second buffer corresponding to the output DL2[3] through the second multiplexer 234 as the input of the second delay line 235 with fixed output, so that the second delay data DL2 is generated and provided to the first delay line 232 through the first multiplexer 231. Then the first delay line 232 starts to sequentially delay the second delay data DL2, so as to generate the first re-trigger delay data DL1B[0]-DL1B[14] when the based clock CLKB is transited from logic high to logic low again. In this embodiment shown in FIG. 3A, FIG. 4A and FIG. 4B, the pulse direction is shifted from the output DL2[3] to the output DL2[0], then from the output DL1[0] to the output DL1[3].

Next, in step S6, the determination circuit 250 compares the first delay data DL1A[0]-DL1A[3] with the first re-trigger delay data DL1B[0]-DL1B[3] to generate the first counting output CO1A after the step S5 is ended based on the determination signal DET_OUT. In the embodiment shown in FIG. 3A, FIG. 4A and FIG. 4B, the determination circuit 250 determines whether the first delay data DL1A [0]-DL1A[3] from the data storage circuit 233 and the first re-trigger delay data DL1B[0]-DL1B[3] from the first delay line 232 are identical, and latches the determination result based on the latch signal DET_LAT and waits for outputting the first counting output CO1A. In details, if the first delay data DL1A[0]-DL1A[3] and the first re-trigger delay data DL1B[0]-DL1B[3] are identical or all of the first delay data DL1A[0]-DL1A[3] and the first re-trigger delay data DL1B [0]-DL1B[3] are logic 1, the first counting output CO1A equal to logic 1 will be outputted which represents the comparator output signals CMP1 is enabled after the half of duty of the base clock CLKB as shown in FIG. 3A. On the other hand, if the first delay data DL1A[0]-DL1A[3] and the first re-trigger delay data DL1B[0]-DL1B[3] are not identical or not all of the first delay data DL1A[0]-DL1A[3] and the first re-trigger delay data DL1B[0]-DL1B[3] are logic 1, the first counting output CO1A equal to logic 0 will be outputted which represents that the comparator output signals CMP1 is enabled before the half of duty of the base clock CLKB (not drawn).

Figure 3B:
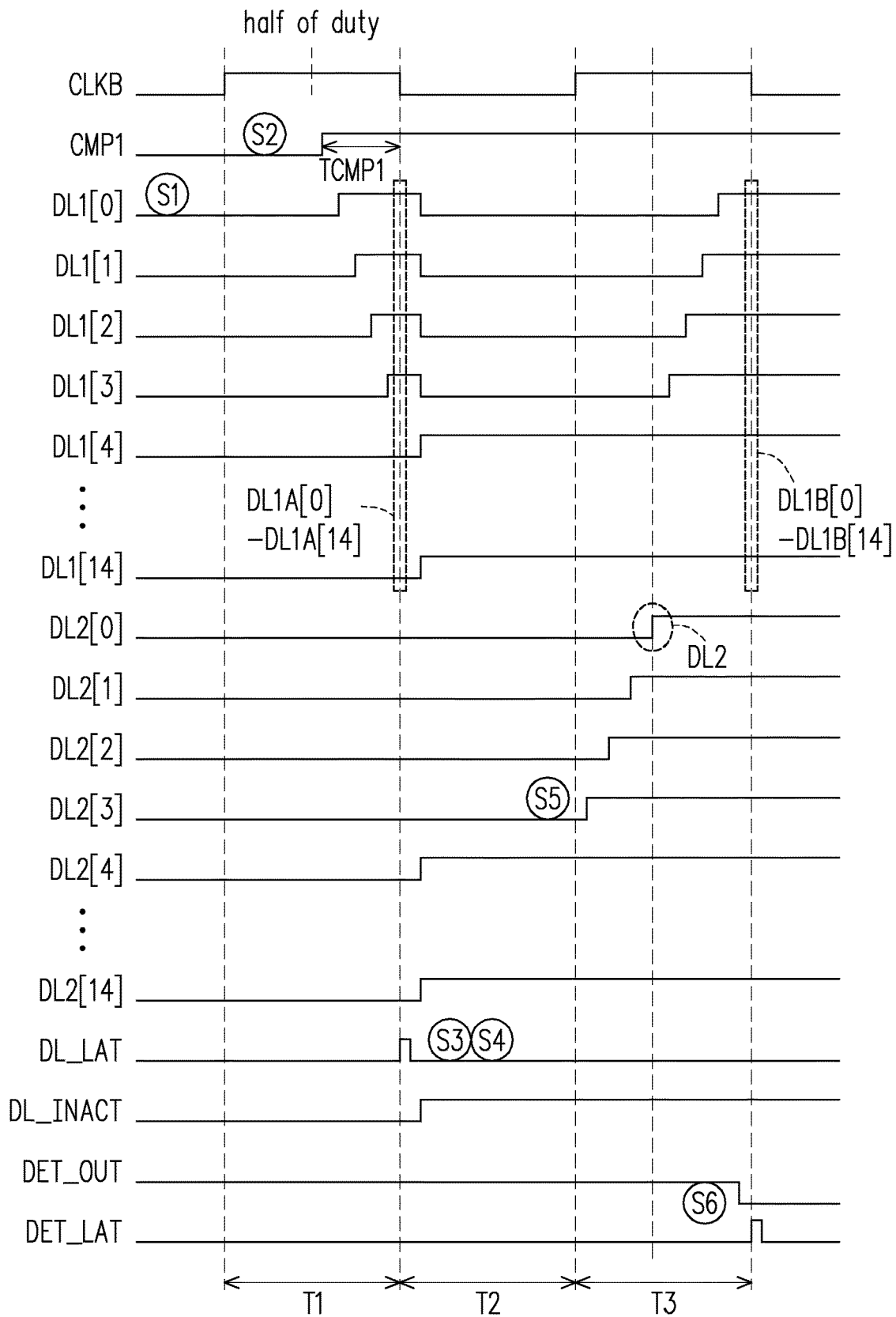
FIG. 3B is a timing diagram illustrating a local counting according to another embodiment of the invention.

In another embodiment shown in FIG. 3B, the determination circuit 250 only determines whether the first delay data DL1A[0] (the start data of the first delay data DL1A [0]-DL1A[14]) and the first re-trigger delay data DL1B[0] (the start data of the first delay data DL1A[0]-DL1A[14]) are identical, to further save the computing resource. It is noted that in this embodiment, the shift pulse direction is shifted from the output DL2[3] to the output DL2[0], then from the output DL1[3] to the output DL1[0], which is distinct from the step S5 of FIG. 4B (not drawn).

As such, the timing of enabling the comparator output signals CMP1 whether before the half of duty of the first period T1 or after the half of duty of the first period T1 shown in FIG. 3A and FIG. 3B would be certainly determined. In other words, additional one bit is added to the resolution of CADC in this embodiment.

Figure 5:
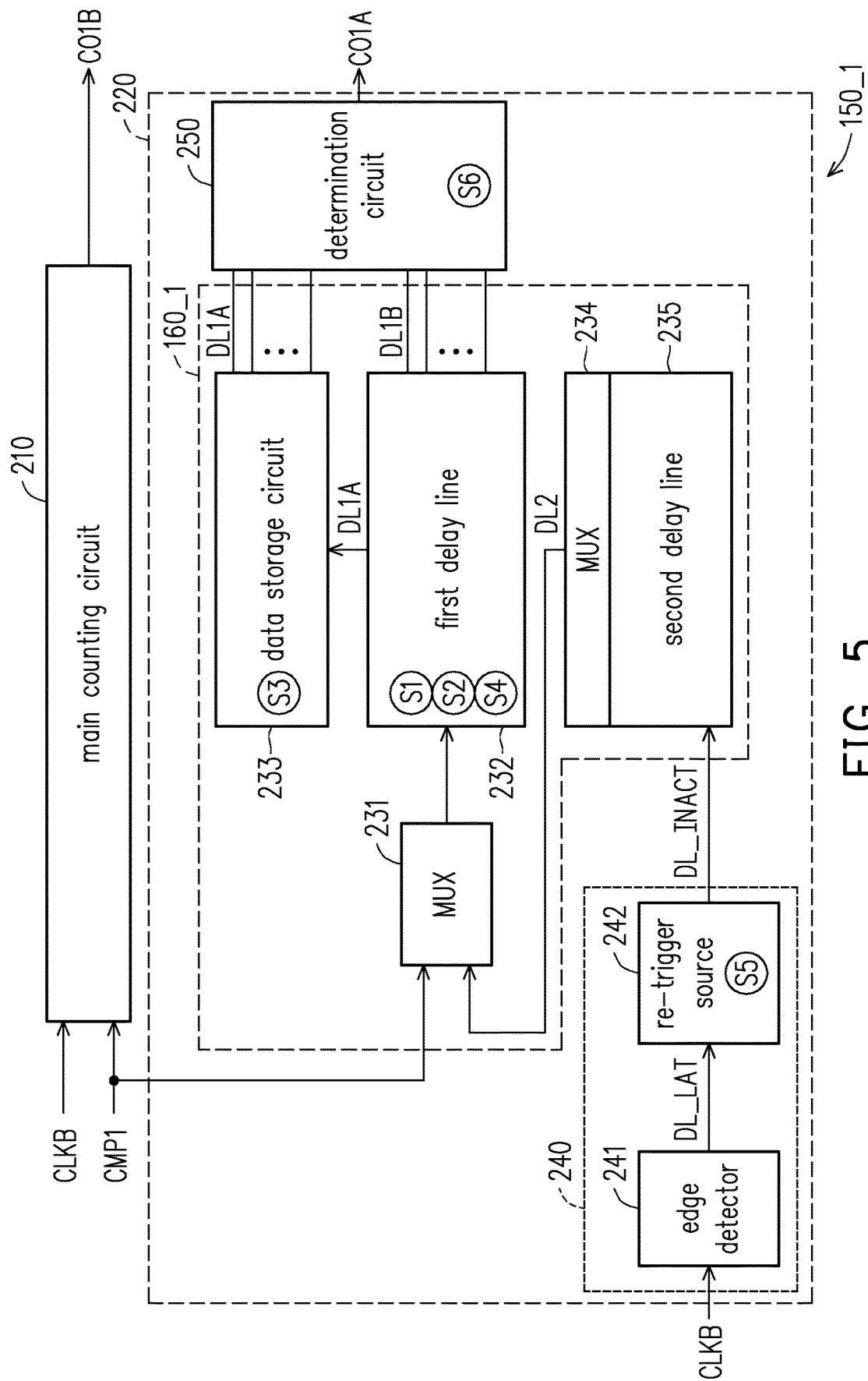
FIG. 5 is a circuit block diagram illustrating a counting circuit according to another embodiment of the invention.

In another embodiment shown FIG. 5, the second multiplexer 234 is coupled between the second delay line 235 and the first multiplexer 231, and the second delay line circuit 235 is coupled between the re-trigger circuit 240 and the second multiplexer 234. In this embodiment, when the base clock CLKB is transited to logic high again detected by the edge detector 241 (like the step S5 in FIG. 4B), the re-trigger source 242 re-triggers the enabled second buffers of the second delay line 235 to sequentially generate the outputs DL2[3]-DL2[0] then selecting the second buffer corresponding to the output DL2[0] through the second multiplexer 234 as the output of the second delay line 235 with fixed input, so that the second delay data DL2[0] is outputted to the first delay line 232 through the first multiplexer 231.

Figure 6:
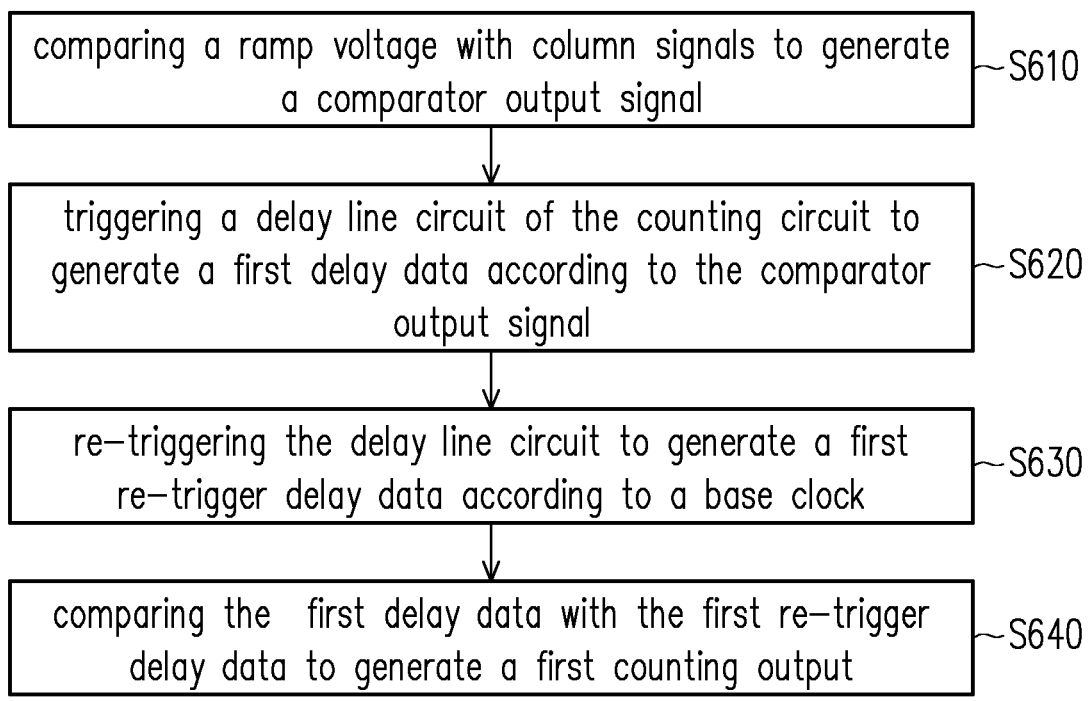
FIG. 6 is a flowchart illustrating a local counting method according to an embodiment of the invention.

FIG. 6 illustrates a flow chart of a local counting method according to one of the exemplary embodiments of the disclosure. A column analog-to-digital converter includes a plurality of analog-to-digital converters in parallel. The local counting method of each analog-to-digital converter is shown as below. In step S610, each analog-to-digital converter compares a ramp voltage with one of column signals to generate a comparator output signal. Next, in step S620, each analog-to-digital converter triggers a delay line circuit of each analog-to-digital converter to generate first delay data according to the comparator output signal. In step S630, each analog-to-digital converter re-triggers the delay line circuit to generate first re-trigger delay data according to a base clock. Next, in step S640, each analog-to-digital converter compares the first delay data with the first re-trigger delay data to generate a first counting output.

Based on the above, in the embodiments of the invention, in order to cope with the frequency limit caused by a timing violation and a long wire and to reduce a system complexity, the embodiments of the invention provide a column analog-to-digital converter (CADC) with a local counting method which enables a local counting by means of comparing the triggered result and re-triggered result of a local delay line circuit, so as to raise the counting resolution and perform a self-compensation without trim circuits.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A column analog-to-digital converter, comprising a plurality of analog-to-digital converters in parallel, wherein each of the analog-to-digital converters comprises:
   a comparator, configured to compare a ramp voltage with one of a plurality of column signals to generate a comparator output signal; and
   a counting circuit, configured to trigger a delay line circuit of the counting circuit to generate a plurality of first delay data according to the comparator output signal, re-trigger the delay line circuit to generate a plurality of first re-trigger delay data according to a base clock, and compare the plurality of first delay data with the plurality of first re-trigger delay data to generate a first counting output.

2. The column analog-to-digital converter as claimed in claim 1, wherein the counting circuit further counts the base clock to generate a second counting output based on the comparator output signal, and combines the first counting output with the second counting output to generate a counting output.

3. The column analog-to-digital converter as claimed in claim 1, further comprising:
   a digital-to-analog converter, configured to generate the ramp voltage; and
   a sense amplifier, configured to receive a counting output generated by each of the analog-to-digital converters to generate an output.

4. The column analog-to-digital converter as claimed in claim 1, wherein the counting circuit comprises:
   a main counting circuit, configured to count the base clock to generate a second counting output before the comparator output signal is enabled;
   a local counting circuit, configured to trigger the delay line circuit to generate the first delay data according to the comparator output signal after the comparator output signal is enabled, re-trigger the delay line circuit according to the base clock to generate the first re-trigger delay data, and compare the first delay data with the first re-trigger delay data to generate a first counting output.

5. The column analog-to-digital converter as claimed in claim 4, wherein the local counting circuit comprises:
   the delay line circuit, configured to be triggered to generate the first delay data during a first period of the base clock according to the comparator output signal;
   a re-trigger circuit, coupled to the delay line circuit, configured to output a re-trigger signal to the delay line circuit according to the base clock during a second period, and re-trigger the delay line circuit to generate the first re-trigger delay data according to the re-trigger signal during a third period, wherein the second period is later than the first period, and the third period is later than the second period; and
   a determination circuit, coupled to the delay line circuit, configured to compare the first delay data with the first re-trigger delay data to generate the first counting output.

6. The column analog-to-digital converter as claimed in claim 5, wherein the delay line circuit comprises:
   a first multiplexer, configured to receive the comparator output signal and a second delay data, and select the comparator output signal to be outputted during the first period and select the second delay data to be outputted during the third period;
   a first delay line, coupled to the first multiplexer, comprising a plurality of first buffers in series, configured to sequentially delay the comparator output signal to generate the first delay data during the first period, and sequentially delay the second delay data to generate the first re-trigger delay data during the third period;
   a data storage circuit, coupled between the first delay line and the determination circuit, configured to store the first delay data according to a delay line data latch signal during the second period;
   a second multiplexer; and
   a second delay line, comprising a plurality of second buffers in series,
   wherein during the second period, the first buffers and the second buffers corresponding to non-inverted first delay data are disabled according to the re-trigger signal,
   wherein during the third period, the second buffers generate the second delay data according to the re-trigger signal and the base clock, and the first buffers sequentially delay the second delay data to generate the first re-trigger delay data.

7. The column analog-to-digital converter as claimed in claim 6, wherein the second multiplexer is coupled between the re-trigger circuit and the second delay line circuit, or coupled between the second delay line circuit and the first multiplexer.

8. The column analog-to-digital converter as claimed in claim 5, wherein the re-trigger circuit comprises:
    edge detector, configured to receive the base clock, and detect the transition of the base clock to generate a delay line data latch signal in the beginning of the second period; and
    re-trigger source, coupled to the edge detector, configured to perform a step transformation on the delay line data latch signal to generate the re-trigger signal during the second period.

9. The column analog-to-digital converter as claimed in claim 5, wherein the determination circuit further determines whether the first delay data which are not disabled and the first re-trigger delay data which are not disabled are identical to generate the first counting output.

10. The column analog-to-digital converter as claimed in claim 5, wherein the determination circuit further determines whether a start data of the first delay data and a start data of the first re-trigger delay data are identical to generate the first counting output.

11. A local counting method, adapted to a column analog-to-digital converter comprising a plurality of analog-to-digital converters in parallel, wherein the local counting method of each analog-to-digital converter comprises:
    comparing a ramp voltage with one of a plurality of column signals to generate a comparator output signal;
    triggering a delay line circuit of each analog-to-digital converter to generate a plurality of first delay data according to the comparator output signal;
    re-triggering the delay line circuit to generate a plurality of first re-trigger delay data according to a base clock;
    comparing the plurality of first delay data with the plurality of first re-trigger delay data to generate a first counting output.

12. The local counting method as claimed in claim 11, further comprising:
    counting the base clock to generate a second counting output based on the comparator output signal; and
    combining the first counting output with the second counting output to generate a counting output.

13. The local counting method as claimed in claim 11, wherein the step of comparing a ramp voltage with one of a plurality of column signals to generate a comparator output signal comprises:
    generating the ramp voltage; and
    receive a counting output generated by each of the analog-to-digital converters to generate an output.

14. The local counting method as claimed in claim 11, further comprising:
    triggering the delay line circuit, to generate the first delay data during a first period of the base clock according to the comparator output signal;
    outputting a re-trigger signal to the delay line circuit according to the base clock during a second period, and re-triggering the delay line circuit to generate the first re-trigger delay data according to the re-trigger signal during a third period, wherein the second period is later than the first period, and the third period is later than the second period; and
    comparing the first delay data with the first re-trigger delay data to generate the first counting output.

15. The local counting method as claimed in claim 14, wherein
    during the first period, selecting the comparator output signal to be outputted, sequentially delaying the comparator output signal to generate the first delay data;
    during the second period, storing the first delay data according to a delay line data latch signal, and disabling the buffers corresponding to non-inverted first delay data according to the re-trigger signal; and
    during the third period, selecting the second delay data to be outputted during the third period, generating the second delay data according to the re-trigger signal and the base clock, and sequentially delaying the second delay data to generate the first re-trigger delay data.

16. The local counting method as claimed in claim 14, further comprising
    detecting the transition of the base clock to generate a delay line data latch signal in the beginning of the second period; and
    performing a step transformation on the delay line data latch signal to generate the re-trigger signal during the second period.

17. The local counting method as claimed in claim 14, wherein the step of comparing the first delay data with the first re-trigger delay data to generate the first counting output further comprises:
    determining whether the first delay data which are not disabled and the first re-trigger delay data which are not disabled are identical to generate the first counting output.

18. The local counting method as claimed in claim 14, wherein the step of comparing the first delay data with the first re-trigger delay data to generate the first counting output further comprises:
    determining whether a start data of the first delay data and a start data of the first re-trigger delay data are identical to generate the first counting output.

* * * * *